United States Patent
Ji et al.

(10) Patent No.: US 9,406,678 B2
(45) Date of Patent: Aug. 2, 2016

(54) METHOD AND GATE STRUCTURE FOR THRESHOLD VOLTAGE MODULATION IN TRANSISTORS

(71) Applicant: SK hynix Inc., Gyeonggi-do (KR)

(72) Inventors: Yun-Hyuck Ji, Gyeonggi-do (KR);
Moon-Sig Joo, Gyeonggi-do (KR);
Se-Aug Jang, Gyeonggi-do (KR);
Seung-Mi Lee, Gyeonggi-do (KR);
Hyung-Chul Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/213,420

(22) Filed: Mar. 14, 2014

(65) Prior Publication Data

US 2015/0123167 A1    May 7, 2015

(30) Foreign Application Priority Data

Nov. 4, 2013    (KR) ........................ 10-2013-0132918

(51) Int. Cl.
*H01L 21/8238*    (2006.01)
*H01L 27/092*    (2006.01)
*H01L 29/51*    (2006.01)

(52) U.S. Cl.
CPC .... *H01L 27/0922* (2013.01); *H01L 21/823857* (2013.01); *H01L 29/512* (2013.01)

(58) Field of Classification Search
CPC .............. H01L 27/0922; H01L 29/512; H01L 21/823857; H01L 21/823807; H01L 27/092; H01L 21/823842; H01L 21/28202; H01L 29/495; H01L 29/4966; H01L 21/28079; H01L 21/28088
See application file for complete search history.

(56) References Cited

U.S. PATENT DOCUMENTS

| | | | |
|---|---|---|---|
| 7,651,935 B2 | 1/2010 | Adetutu et al. | |
| 2009/0093097 A1* | 4/2009 | Kim | 438/275 |
| 2010/0133623 A1* | 6/2010 | Inumiya et al. | 257/369 |
| 2010/0176456 A1* | 7/2010 | Ikeno et al. | 257/369 |
| 2010/0320547 A1* | 12/2010 | Ando et al. | 257/411 |
| 2011/0227163 A1* | 9/2011 | Wang et al. | 257/369 |
| 2011/0237084 A1 | 9/2011 | Luong et al. | |
| 2011/0309455 A1* | 12/2011 | Ando | H01L 21/28079 257/410 |
| 2012/0025327 A1* | 2/2012 | Ji | H01L 21/823462 257/411 |
| 2013/0032900 A1 | 2/2013 | Hou et al. | |
| 2013/0034940 A1* | 2/2013 | Ando et al. | 438/199 |
| 2013/0105901 A1* | 5/2013 | Park et al. | 257/368 |
| 2013/0105905 A1* | 5/2013 | Ji et al. | 257/369 |
| 2013/0285150 A1* | 10/2013 | Chen et al. | 257/369 |
| 2014/0001516 A1* | 1/2014 | Ando et al. | 257/194 |

(Continued)

*Primary Examiner* — Jarrett Stark
*Assistant Examiner* — Bitew Dinke
(74) *Attorney, Agent, or Firm* — IP & T Group LLP

(57) ABSTRACT

A method of fabricating a semiconductor device. A substrate (PMOS/NMOS regions) is prepared. A high-k dielectric layer is formed over the substrate. A threshold voltage modulation layer is formed over the dielectric layer of the NMOS region. A first work function layer is formed over the threshold voltage modulation layer and the dielectric layer of the PMOS region. An oxidation suppressing layer is formed over the first work function layer of the NMOS region. A second work function layer is formed over the oxidation suppressing layer and the first work function layer of the PMOS region. A first gate stack including the dielectric layer, the first work function layer and the second work function layer is formed over the PMOS region. A second gate stack including the dielectric layer, the threshold voltage modulation layer, the first work function layer and the oxidation suppressing layer is formed over NMOS region.

15 Claims, 13 Drawing Sheets

(56) References Cited

U.S. PATENT DOCUMENTS

| | | | |
|---|---|---|---|
| 2014/0004695 A1* | 1/2014 | Ando et al. | 438/591 |
| 2014/0120668 A1* | 5/2014 | Chambers et al. | 438/199 |
| 2014/0183651 A1* | 7/2014 | Lee et al. | 257/369 |

* cited by examiner

METHOD AND GATE STRUCTURE FOR THRESHOLD VOLTAGE MODULATION IN TRANSISTORS

CROSS-REFERENCE TO RELATED APPLICATIONS

The present application claims priority of Korean Patent Application No. 10-2013-0132918, filed on Nov. 4, 2013, which is incorporated herein by reference in its entirety.

BACKGROUND

1. Field

Exemplary embodiments of the present invention relate to a semiconductor device, and more particularly, to a method and a gate structure for threshold voltage modulation in transistors.

2. Description of the Related Art

If a transistor is scaled down to improve the performance thereof, gate leakage may increase as a thickness of a gate dielectric layer is reduced. In order to cope with this concern, the material of a gate dielectric layer may be replaced with a high-k material having a dielectric constant that is larger than the dielectric constant of $SiO_2$. The high-k material may include a metal oxide containing hafnium, zirconium, or the like. However, the use of the high-k material creates a concern of a Fermi level pinning effect. This concern is raised due to contact between the high-k material and a polysilicon gate electrode. Fermi level pinning is a basic characteristic of an interface between a polysilicon gate electrode and a metal oxide, and tends to increase the threshold voltage of a transistor.

Recently, in order to overcome Fermi level pinning, a gate stack including a high-k material and a metal gate electrode has been suggested. However, when fabricating a CMOS device, it is difficult to form metal gate electrodes with an N-type work function and a P-type work function that require threshold voltages (Vt) appropriate for respective transistors. Also, even when metal gate electrodes with work functions appropriate for respective transistors are formed, the effective work functions of gate stacks may be changed due to various factors that are based on the material of a gate dielectric layer, a gate stack forming process (for example, an etching process and a thermal process at a high temperature), and so forth.

SUMMARY

In an embodiment, a method of fabricating a semiconductor device may include: preparing a substrate including a PMOS region and an NMOS region; forming a high-k dielectric layer over the substrate; forming a threshold voltage modulation layer over the high-k dielectric layer of the NMOS region; forming a first work function layer over the threshold voltage modulation layer and the high-k dielectric layer of the PMOS region; forming an oxidation suppressing layer over the first work function layer of the NMOS region; forming a second work function layer over the oxidation suppressing layer and the first work function layer of the PMOS region; forming, over the PMOS region of the substrate, a first gate stack that includes the high-k dielectric layer, the first work function layer and the second work function layer; and forming, over the NMOS region of the substrate, a second gate stack that includes the high-k dielectric layer, the threshold voltage modulation layer, the first work function layer and the oxidation suppressing layer.

In an embodiment, a method of fabricating a semiconductor device may include: preparing a substrate including a PMOS region and an NMOS region; forming a germanium-containing channel region over the PMOS region of the substrate; forming a high-k dielectric layer over the substrate; forming a threshold voltage modulation layer that includes a lanthanum series element, over the high-k dielectric layer of the NMOS region; forming a first titanium nitride layer over the threshold voltage modulation layer and the high-k dielectric layer of the PMOS region; forming, over the first titanium nitride layer of the NMOS region, an oxidation suppressing layer that contains silicon; forming a second titanium nitride layer over the oxidation suppressing layer and the first titanium nitride layer of the PMOS region; forming, over the PMOS region of the substrate, a first gate stack that includes the high-k dielectric layer, the first titanium nitride layer and the second titanium nitride layer; and forming, over the NMOS region of the substrate, a second gate stack that includes the high-k dielectric layer, the threshold voltage modulation layer, the first titanium nitride layer and the oxidation suppressing layer.

In an embodiment, a semiconductor device may include an N-channel transistor and a P-channel transistor, wherein a gate stack of the P-channel transistor comprises a first work function layer that includes a dual layer of titanium nitrides, and wherein a gate stack of the N-channel transistor comprises a lanthanum-based threshold voltage modulation layer, a second work function layer that includes a single layer of a titanium nitride over the threshold voltage modulation layer, and an oxidation suppressing layer over the second work function layer.

According to the embodiments, since a germanium-containing channel region and a thick P type work function gate electrode are included, it is possible to modulate the threshold voltage of a P channel transistor.

Also, according to the embodiments, since a dipole interface and a thin N type work function gate electrode are included, it is possible to modulate the threshold voltage of an N channel transistor.

Moreover, according to the embodiments, since an oxidation suppressing layer is formed on the N type work function gate electrode, it is possible to substantially prevent the effective work function of a gate stack from being increased.

Further, according to the embodiments, since an oxide is formed on the P type work function gate electrode, it is possible to increase the effective work function of a gate stack.

As a result, according to the embodiments, the threshold voltages of an N channel transistor and a P channel transistor may be independently modulated in the integration process of a CMOS device.

DETAILED DESCRIPTION

Figure 1:
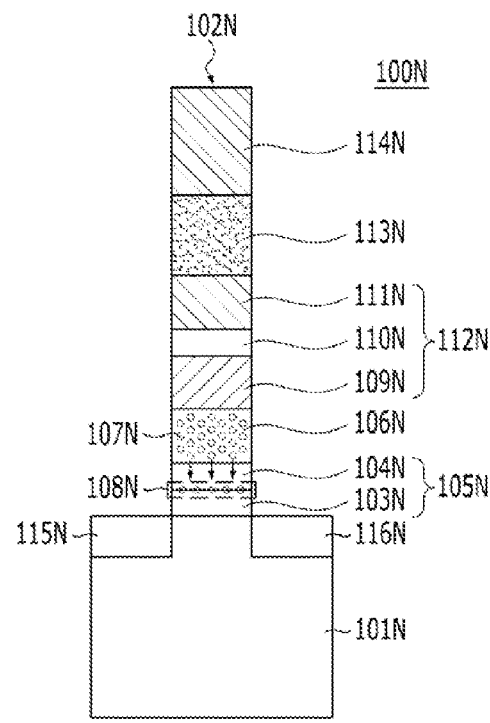
FIG. 1 is a view illustrating a transistor in accordance with a first embodiment of the present invention.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. Throughout the disclosure, reference numerals correspond directly to the like numbered parts in the various figures and embodiments of the present invention. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

FIG. 1 is a view illustrating a transistor in accordance with a first exemplary implementation.

Referring to FIG. 1, a transistor 100N may include a gate stack 102N, a source region 115N and a drain region 116N. The transistor 100N may be an N-channel transistor, for example, an NMOSFET.

The gate stack 102N is formed on a substrate 101N. The gate stack 102N may include a gate dielectric layer 105N, a threshold voltage modulation layer 106N, and a gate electrode 112N. The gate dielectric layer 105N may include an interface layer 103N and a high-k dielectric layer 104N. The threshold voltage modulation layer 106N may be formed between the high-k dielectric layer 104N and the gate electrode 112N. The gate electrode 112N may include a work function layer 109N, an oxidation suppressing layer 110N and a non-work function layer 111N. A capping layer 113N may be formed on the gate electrode 112N. A low resistance layer 114N may be formed on the capping layer 113N.

The interface layer 103N may include a silicon oxide or a silicon oxynitride. For example, the interface layer 103N may include $SiO_2$ or SiON. The interface layer 103N plays the role of improving the characteristic of the interface between the substrate 101N and the high-k dielectric layer 104N and thereby improving a carrier mobility characteristic.

The high-k dielectric layer 104N has a high dielectric constant (high-k). The high-k dielectric layer 104N has a dielectric constant larger than the dielectric constant (approximately 3.9) of $SiO_2$. The high-k dielectric layer 104N is physically substantially thicker than $SiO_2$, and has an equivalent oxide thickness (EOT) value smaller than $SiO_2$. The high-k dielectric layer 104N may have a dielectric constant larger than the interface layer 103N. The high-k dielectric layer 104N may include a metal oxide, a metal silicate, or a metal silicate nitride. The metal oxide may include an oxide containing a metal, such as hafnium (Hf), aluminum (Al), lanthanum (La) and zirconium (Zr). The metal oxide may include a hafnium oxide, an aluminum oxide, a lanthanum oxide, a zirconium oxide, or a combination thereof. For example, the metal oxide may include $HfO_2$, $Al_2O_3$, $La_2O_3$, $ZrO_2$, or a combination thereof. The metal silicate may include a silicate of a metal, such as hafnium (Hf) and zirconium (Zr). For example, the metal silicate may include a hafnium silicate (HfSiO), a zirconium silicate (ZrSiO) or a combination thereof. The metal silicate nitride may include a hafnium silicate nitride (HfSiON), a zirconium silicate nitride (ZrSiON), or a combination thereof.

The threshold voltage modulation layer 106N may include a species 107N to modulate the threshold voltage of the transistor 100N. A dipole-interface 108N is formed in the gate dielectric layer 105N by the diffusion of the species 107N. The dipole-interface 108N is formed on the interface of the interface layer 103N and the high-k dielectric layer 104N. The threshold voltage of the transistor 100N is modulated by the dipole-interface 108N. The species 107N may include a lanthanum series element. The threshold voltage modulation layer 106N may include a lanthanum oxide.

The gate electrode 112N has a work function appropriate for the transistor 100N. For example, the gate electrode 112N may have an N-type work function appropriate for an N-channel transistor. The thickness of the gate electrode 112N is controlled to have an N-type work function. The gate electrode 112N may be the stack structure of the work function layer 109N, the oxidation suppressing layer 110N and the non-work function layer 111N. The work function layer 109N may include a work function metal layer that has an N-type work function. The oxidation suppressing layer 110N suppresses the oxidation of the work function layer 109N. The non-work function layer 111N does not exert any influence on the work function of the gate electrode 112N. The work function layer 109N may include a titanium nitride. The titanium nitride may have a stoichiometric composition ratio. That is to say, the composition ratio between titanium and nitrogen is approximately 1:1. The oxidation suppressing layer 110N may include a silicon layer. The non-work function layer 111N may include a titanium nitride. The oxidation suppressing layer 110N substantially prevents the reaction of the work function layer 109N and the non-work function layer 111N. The work function layer 109N and the non-work function layer 111N may include titanium nitrides with the same work function.

The capping layer 113N may include a polysilicon layer. The capping layer 113N protects the gate electrode 112N from a subsequent process.

The low resistance layer 114N may include a metal silicide. The low resistance layer 114N reduces the resistance of the gate stack 102N. The low resistance layer 114N may include a silicide layer, which contains platinum and nickel.

The source region 115N and the drain region 116N in N-type impurities.

In FIG. 1, the dipole-interface 108N is formed by an annealing process. For example, the dipole-interface 108N is formed by an annealing process to activate the source region 115N and the drain region 116N. Also, the dipole-interface 108N may be formed by an annealing process to form a silicide layer as the low resistance layer 114N.

In the first embodiment, a flat band voltage is decreased due to a dipole effect by the dipole-interface 108N. Further, a work function is decreased by the oxidation suppressing layer 110N.

Accordingly, the threshold voltage of the transistor 100N may be shifted in a desired direction.

Figure 2A:
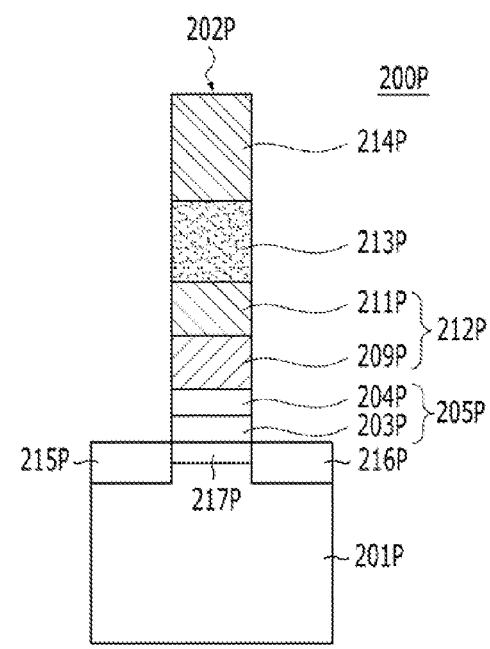
FIG. 2A is a view illustrating a transistor in accordance with a second embodiment of the present invention.
Figure 2B:
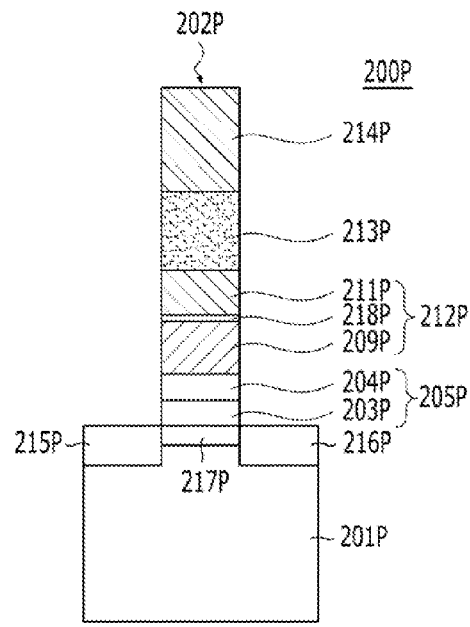
FIG. 2B is a view illustrating a transistor in accordance with a variation of the second embodiment.

FIG. 2A is a view illustrating a transistor in accordance with a second embodiment. FIG. 2B is a view illustrating a transistor in accordance with a variation of the second embodiment.

Referring to FIGS. 2A and 2B, a transistor 200P may include a gate stack 202P, a source region 215P and a drain region 216P. The transistor 200P may include a P-channel transistor. The transistor 200P may include a PMOSFET.

The gate stack 202P is formed on a substrate 201P. The gate stack 202P may include a gate dielectric layer 205P, and a gate electrode 212P. The gate dielectric layer 205P may include an interface layer 203P and a high-k dielectric layer 204P. The gate electrode 212P may include a work function layer 209P and an oxidation promoting layer 211P. A capping layer 213P is formed on the gate electrode 212P. A low resistance layer 214P is formed on the capping layer 213P.

The interface layer 203P may include a silicon oxide or a silicon oxynitride. For example, the interface layer 203P may include $SiO_2$ or SiON. The interface layer 203P improves the characteristic of the interface between the substrate 201P and the high-k dielectric layer 204P and thereby improves a carrier mobility characteristic.

The high-k dielectric layer 204P has a high dielectric constant (high-k). The high-k dielectric layer 204P has a dielectric constant larger than the dielectric constant (approximately 3.9) of $SiO_2$. The high-k dielectric layer 204P is physically substantially thicker than $SiO_2$, and has an equivalent oxide thickness (EOT) value smaller than $SiO_2$. The high-k dielectric layer 204P may have a dielectric constant larger than the interface layer 203P. The high-k dielectric layer 204P may include a metal oxide, a metal silicate, or a metal silicate nitride. The metal oxide may include an oxide containing a metal, such as hafnium (Hf), aluminum (Al), lanthanum (La) and zirconium (Zr). The metal oxide may include a hafnium oxide, an aluminum oxide, a lanthanum oxide, a zirconium oxide, or a combination thereof. For example, the metal oxide may include $HfO_2$, $Al_2O_3$, $La_2O_3$, $ZrO_2$, or a combination thereof. The metal silicate may include a silicate of a metal, such as hafnium (Hf) and zirconium (Zr). For example, the metal silicate may include a hafnium silicate (HfSiO), a zirconium silicate (ZrSiO) or a combination thereof. The metal silicate nitride may include a hafnium silicate nitride (HfSiON), a zirconium silicate nitride (ZrSiON), or a combination thereof.

The gate electrode 212P has a work function to modulate the threshold voltage of the transistor 200P. The gate electrode 212P is thick due to the fact that the first work function layer 209P and the second work function layer 211P are stacked. The first work function layer 209P and the second work function layer 211P may include materials with the same work function. The first work function layer 209P and the second work function layer 211P may include titanium nitrides with the same work function. As the gate electrode 212P, a first titanium nitride and a second titanium nitride may be stacked. A work function is increased by a thicker titanium nitride. Moreover, the work function is further increased by the second work function layer 211P.

FIG. 2B illustrates a modification of the implementation shown in FIG. 2A. As shown in FIG. 2B, the gate electrode 212P further may include an oxide 218P between the first work function layer 209P and the second work function layer 211P. As the gate electrode 212P, a first titanium nitride, a titanium oxynitride, and a second titanium nitride may be stacked. The first titanium nitride is the first work function layer 209P, and the second titanium nitride is the second work function layer 211P. The titanium oxynitride is the oxide of the first work function layer 209P. An oxide of the first work function layer 209P may be formed on the surface of the first work function layer 209P by the second work function layer 211P. The work function is further increased by such an oxide.

The gate electrode 212P has a work function appropriate for the transistor 200P. The gate electrode 212P may include a P-type work function appropriate for a P-channel transistor. The gate electrode 212P may have a thickness thicker than the gate electrode 212P shown in FIG. 2A.

The capping layer 213P may include a polysilicon layer. The capping layer 213P protects the gate electrode 212P from a subsequent process.

The low resistance layer 214P may include a metal silicide. The low resistance layer 214P reduces the resistance of the gate stack 202P. The low resistance layer 214P may include a silicide layer that contains platinum and nickel.

The source region 215P and the drain region 216P include P-type impurities. A germanium-containing channel region 217P is formed between the source region 215P and the drain region 216P. The germanium-containing channel region 217P may include an epitaxial layer that includes germanium. The germanium-containing channel region 217P may include an SiGe/Si epitaxial layer in which a silicon-germanium epitaxial layer and a silicon epitaxial layer are stacked.

In the present second embodiment, the threshold voltage of the transistor 200P is modulated due to a valence band offset by the germanium-containing channel region 217P. Furthermore, the threshold voltage of the transistor 200P is modulated by the surface oxidation of the first work function layer 209P and the thick thickness of the first work function layer 209P and the second work function layer 211P.

As a result, the threshold voltage of the transistor 200P may be shifted in a desired direction. Moreover, since the germanium-containing channel region 217P may include the SiGe/Si epitaxial layer, threshold voltage modulation becomes easier.

Figure 3A:
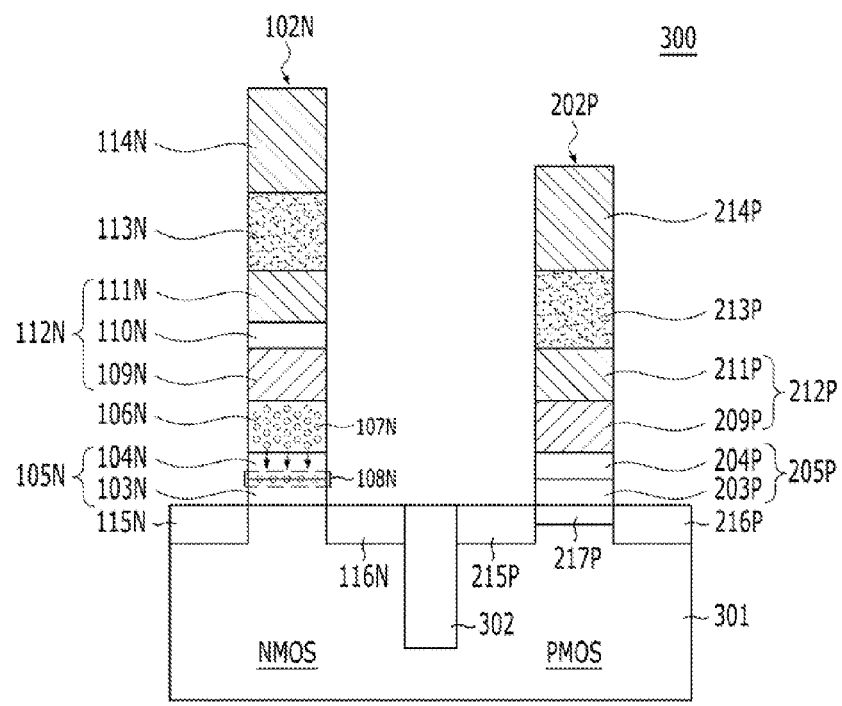
FIG. 3A is a view illustrating an exemplary CMOS device to which the first embodiment and the second embodiment are applied.
Figure 3B:
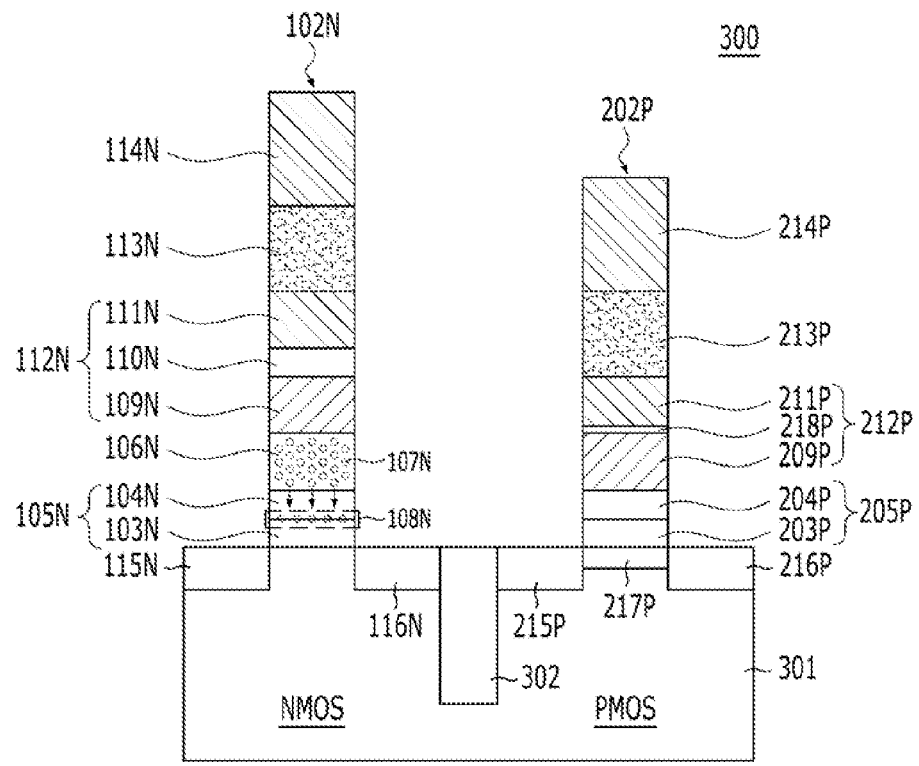
FIG. 3B is a view illustrating an exemplary CMOS device to which the first embodiment and the variation of the second embodiment are applied.

FIG. 3A is a view illustrating an exemplary CMOS device to which the first exemplary implementation and the second exemplary implementation are applied. FIG. 3A shows a CMOSFET in which the N-channel transistor of FIG. 1 and the P-channel transistor of FIG. 2A are integrated. FIG. 3B is a view illustrating an exemplary CMOS device to which the first embodiment and the variation of the second embodiment are applied. FIG. 3B shows a CMOSFET in which the N-channel transistor of FIG. 1 and the P-channel transistor of FIG. 2B are integrated.

Referring to FIGS. 3A and 3B, a CMOSFET 300 may include an N-channel transistor NMOS and a P-channel transistor PMOS. A substrate 301 may include a silicon substrate, a silicon-germanium substrate, or an SOI (silicon-on-insulator) substrate. The N-channel transistor NMOS and the P-channel transistor PMOS are isolated by an isolation region 302. For the N-channel transistor NMOS, reference will be made to the transistor 100N shown in FIG. 1. For the P-channel transistor PMOS, reference will be made to the transistor 200P shown in FIGS. 2A and 2B.

According to FIGS. 3A and 3B, the threshold voltage of the N-channel transistor NMOS and the threshold voltage of the P-channel transistor may be respectively independently modulated.

FIGS. 4A to 4I are views explaining an exemplary method of fabricating the CMOSFET shown in FIG. 3A.

Figure 4A:
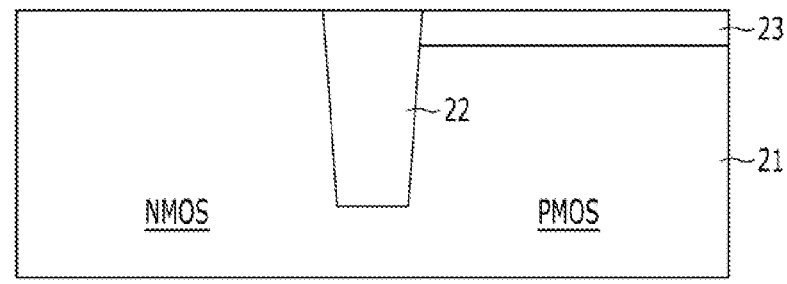
FIGS. 4A to 4I are views showing an exemplary method of fabricating the CMOSFET shown in FIG. 3A.

As shown in FIG. 4A, a substrate 21 is prepared. The substrate 21 may include a plurality of regions where transistors are to be formed. The plurality of regions may include a PMOS region PMOS and an NMOS region NMOS. The substrate 21 may include a semiconductor substrate. The substrate 21 may include a silicon substrate, a silicon-germanium substrate, or an SOI substrate.

An isolation layer 22 is formed in the substrate 21. The isolation layer 22 may be formed through an STI (shallow trench isolation) process. For instance, after forming a pad layer (not shown) on the substrate 21, the pad layer and the substrate 21 are etched using an isolation mask (not shown). Thus, a trench is defined. The isolation layer 22 may be formed by filling the trench. The isolation layer 22 may be formed by sequentially forming a wall oxide, a liner, fill dielectric may be formed. The liner may be formed by stacking a silicon nitride and a silicon oxide. The silicon nitride may include $Si_3N_4$, and the silicon oxide may include $SiO_2$. The fill dielectric may include a spin-on dielectric (SOD). In another exemplary implementation, the isolation layer 22 may use a silicon nitride as the fill dielectric.

An epitaxial layer 23 including germanium may be selectively formed on the PMOS region PMOS of the substrate 21. As the epitaxial layer 23, a silicon-germanium epitaxial layer and a silicon epitaxial layer may be sequentially formed. The epitaxial layer 23 may be grown after recessing the surface of the PMOS region PMOS of the substrate 21 by a predetermined thickness. In another embodiment, the epitaxial layer 23 may be grown on the substrate 21. In the epitaxial layer 23, each of the silicon-germanium epitaxial layer and the silicon epitaxial layer has a thickness of approximately 100 Å or less. In the silicon-germanium epitaxial layer, the concentration of germanium is controlled to approximately 40 at % or under.

Figure 4B:
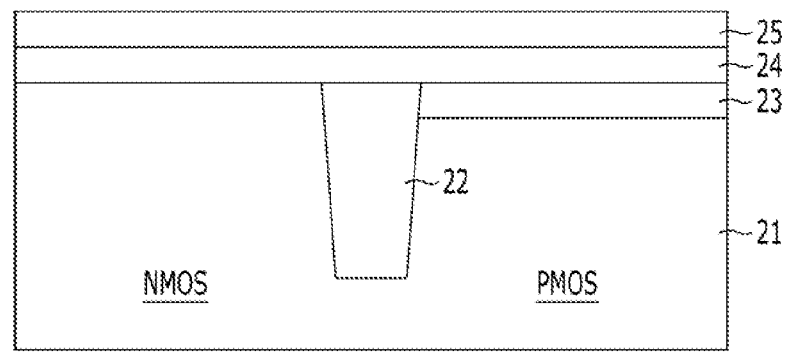

As shown in FIG. 4B, an interface layer 24 may be formed. A high-k dielectric layer 25 is formed on the interface layer 24. Before forming the interface layer 24, a cleaning process may be performed. The cleaning process may use a solution including fluoric acid (HF). By performing the cleaning process in this way, any native oxide on the surface of the substrate 21 may be removed, and dangling bonds on the surface of the substrate 21 are passivated by hydrogen to suppress the native oxide from growing before performing a subsequent process.

The interface layer 24 may include a silicon oxide, a silicon oxynitride, or the like. For example, the interface layer 24 may include $SiO_2$ or SiON. The silicon oxide as the interface layer 24 may be formed using thermal oxidation or may be grown in a wet type using ozone. In particular, in the case where the silicon oxide as the interface layer 24 is grown in a wet type using ozone and the high-k dielectric layer 25 is a silicate material that contains hafnium, a hafnium silicate (HfSiO) with an Hf-rich property due to presence of a large amount of hafnium may be formed when forming the high-k dielectric layer 25. By this fact, an effect that the dielectric constant of the high-k dielectric layer 25 is increased may be accomplished. The interface layer 24 is formed to a thickness of approximately 5 Å to approximately 13 Å. The high-k dielectric layer 25 may include a high-k material with a high dielectric constant.

The high-k dielectric layer 25 may be formed using the same material over the PMOS region PMOS and the NMOS region NMOS. The high-k dielectric layer 25 has a dielectric constant larger than the dielectric constant (approximately 3.9) of $SiO_2$ that is conventionally used as a gate dielectric layer. Further, the high-k dielectric layer 25 is physically substantially thicker than $SiO_2$, and has an equivalent oxide thickness (EOT) value smaller than $SiO_2$. The high-k dielectric layer 25 may have a dielectric constant larger than the interface layer 24.

The high-k dielectric layer 25 may include a metal oxide, a metal silicate, a metal silicate nitride, or the like. The metal oxide may include an oxide containing a metal, such as hafnium (Hf), aluminum (Al), lanthanum (La), or zirconium (Zr). The metal oxide may include a hafnium oxide, an aluminum oxide, a lanthanum oxide, a zirconium oxide, or a combination thereof. For example, the metal oxide may include $HfO_2$, $Al_2O_3$, $La_2O_3$, $ZrO_2$, or a combination thereof. The metal silicate may include a silicate of a metal, such as hafnium (Hf) and zirconium (Zr). For example, the metal silicate may include a hafnium silicate (HfSiO), a zirconium silicate (ZrSiO) or a combination thereof. The metal silicate nitride may include a silicate nitride which may include a metal such as hafnium (Hf) and zirconium (Zr). The metal silicate nitride may include a hafnium silicate nitride (HfSiON), a zirconium silicate nitride (ZrSiON), or a combination thereof.

By simultaneously forming the high-k dielectric layer 25 over the PMOS region PMOS and the NMOS region NMOS, processing may be simplified. Meanwhile, the high-k dielectric layer 25 may be formed using different materials over the PMOS region PMOS and the NMOS region NMOS. A process for forming the high-k dielectric layer 25 may include a deposition technology that is appropriate for a material to be deposited. For example, chemical vapor deposition (CVD), low-pressure CVD (LPCVD), plasma-enhanced CVD (PECVD), metal-organic CVD (MOCVD), atomic layer deposition (ALD), plasma enhanced ALD (PEALD), and so forth may be used. For uniformly forming a layer, atomic layer deposition (ALD) or plasma enhanced ALD (PEALD) may be used. The high-k dielectric layer 25 may be formed to a thickness of approximately 15 Å to approximately 60 Å.

Hereinbelow, in the embodiment, the high-k dielectric layer 25 may use a metal silicate nitride. In order to form a metal silicate nitride as the high-k dielectric layer 25, after first forming a metal silicate, a nitridation process and an annealing process may be sequentially performed. The nitridation process may include a plasma nitridation process. Accordingly, nitrogen is implanted into the high-k dielectric layer 25. For example, in the case where the high-k dielectric layer 25 is a hafnium silicate nitride, after forming a hafnium silicate (HfSiO), HfSiON may be formed by a nitridation process. In this way, by implanting nitrogen into a metal silicate, a dielectric constant is increased, and the crystallization of the metal silicate may be suppressed in a subsequent thermal process. The plasma nitridation process may be performed at a temperature of approximately 400° C. to approximately 600° C. In the plasma nitridation process, a mixed gas of argon (Ar) gas and nitrogen ($N_2$) gas may be used as a reaction gas. As a metal silicate is exposed on nitrogen plasma in such a plasma nitridation process, the metal silicate becomes a metal silicate nitride. As a nitrogen source for nitrogen plasma, other gases may be used instead of nitrogen (N$_2$) gas. For example, the nitrogen source may include ammonia (NH$_3$), hydrazine (N$_2$H$_4$), or the like. After the nitridation process, an annealing process is implemented. Since the annealing process is performed after the nitridation process, the annealing process is referred to as post nitridation anneal. The metal silicate is in a nitrogen-rich state on the surface thereof through the plasma nitridation. By performing the annealing process, the nitrogen atoms implanted into the metal silicate may be uniformly diffused to the inside of the metal silicate. The annealing process may be performed in a nitrogen (N$_2$) gas atmosphere at a temperature of approximately 500° C. to approximately 900° C.

By using the metal silicate forming process, the nitridation process, and the annealing process, as described above, a metal silicate nitride may be formed as the high-k dielectric layer 25. By forming the high-k dielectric layer 25 using the metal silicate nitride, a dielectric constant may be increased, and crystallization may be suppressed in a subsequent thermal process. The interface layer 24 and the high-k dielectric layer 25 may become a gate dielectric layer.

Figure 4C:
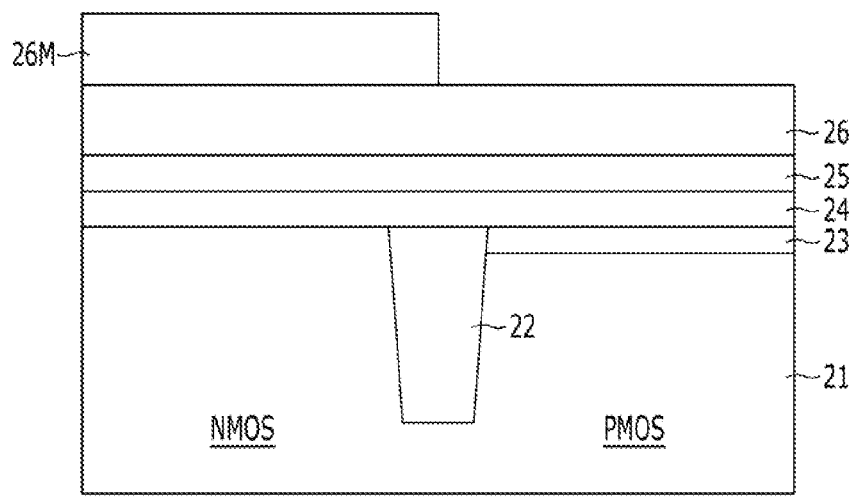

As shown in FIG. 4C, a threshold voltage modulation layer 26 is formed on the high-k dielectric layer 25. The threshold voltage modulation layer 26 contains a species to modulate a threshold voltage. The species may include a lanthanum series element. The threshold voltage modulation layer 26 may include a lanthanum oxide. The threshold voltage modulation layer 26 is formed over both the PMOS region PMOS and the NMOS region NMOS.

A first mask pattern 26M may be formed on the threshold voltage modulation layer 26. The first mask pattern 26M exposes the PMOS region PMOS.

Figure 4D:
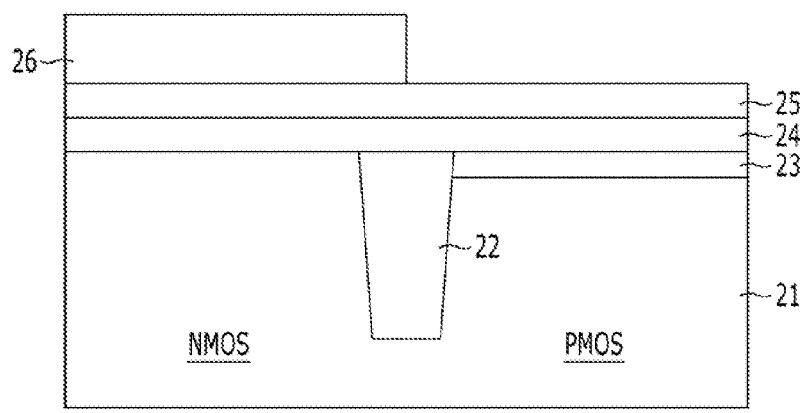

As shown in FIG. 4D, the threshold voltage modulation layer 26 may be removed from the PMOS region PMOS by using the first mask pattern 26M as an etch barrier. According to this fact, the threshold voltage modulation layer 26 remains only on the NMOS region NMOS. In the PMOS region PMOS, since the threshold voltage modulation layer 26 is removed, the high-k dielectric layer 25 is exposed. Then, the first mask pattern 26M may be removed.

Figure 4E:
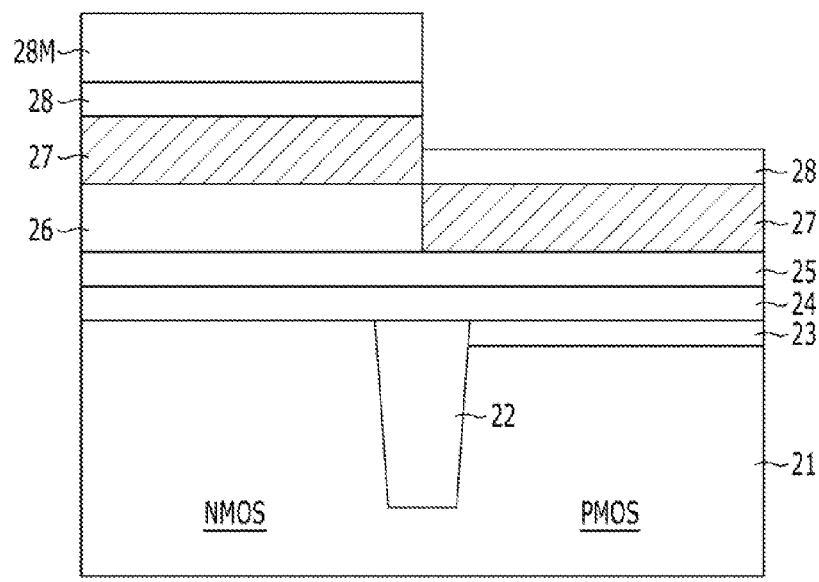

As shown in FIG. 4E, a first work function layer 27 is formed. The first work function layer 27 may be formed on the entire surface of the substrate 21 including the high-k dielectric layer 25 and the threshold voltage modulation layer 26. The first work function layer 27 has a work function appropriate for an N-channel transistor. Accordingly, the first work function layer 27 may include an N-type work function layer. The first work function layer 27 may include an N-type work function metal-containing layer. The N-type work function metal-containing layer may include a material of which work function is approximately 4.1 eV to approximately 4.5 eV. The first work function layer 27 may be controlled in its thickness to have an N-type work function. The first work function layer 27 may include a metal nitride. The first work function layer 27 may include a titanium nitride. The first work function layer 27 may be formed as a stoichiometric titanium nitride. The stoichiometric titanium nitride has the stoichiometric composition ratio of approximately 1:1 between titanium and nitrogen. The titanium nitride may be formed using physical vapor deposition (PVD). Thus, it is possible to control the composition ratio of titanium and nitrogen in the titanium nitride.

An oxidation suppressing layer 28 may be formed on the first work function layer 27. The oxidation suppressing layer 28 substantially prevents the surface of the first work function layer 27 from being oxidized. The oxidation suppressing layer 28 and the first work function layer 27 are formed in-situ without an air break. According to this fact, the surface of the first work function layer 27 is prevented from being oxidized. The oxidation suppressing layer 28 may include a silicon layer.

A second mask pattern 28M is formed. The second mask pattern 28M exposes opens the PMOS region PMOS.

Figure 4F:
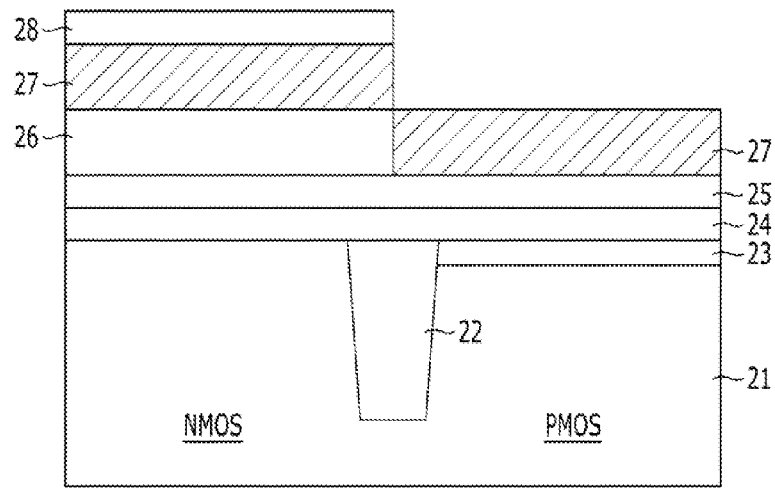

As shown in FIG. 4F, the oxidation suppressing layer 28 may be removed from the PMOS region PMOS by using the second mask pattern 28M as an etch barrier. Thus, the oxidation suppressing layer 28 does not exist in the PMOS region PMOS and exists in only the NMOS region NMOS. Then, the second mask pattern 28M may be removed.

Figure 4G:
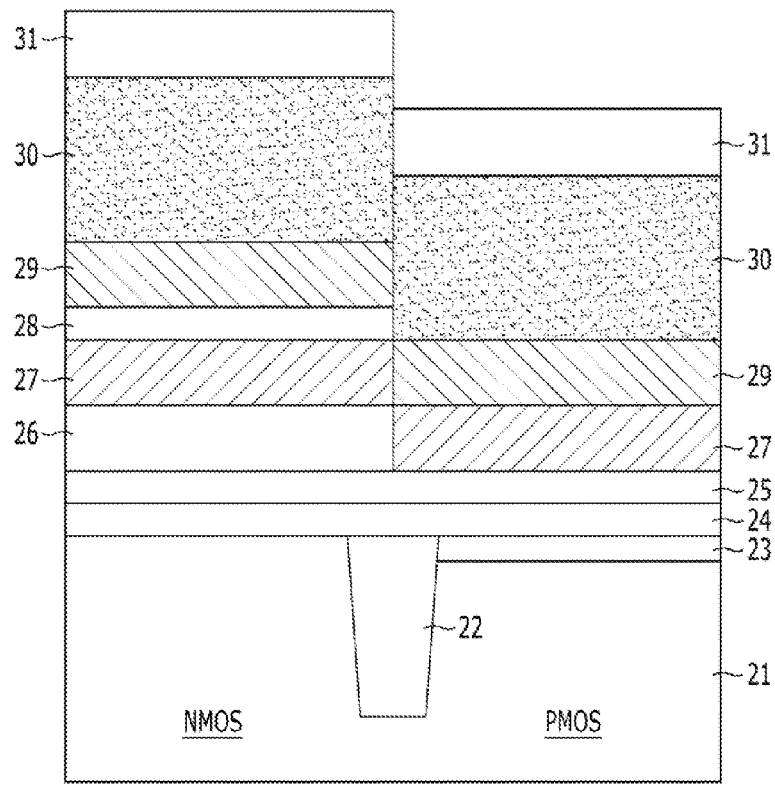

As shown in FIG. 4G, a second work function layer 29 may be formed over the substrate 21. The second work function layer 29 may be formed using the same material as the first work function layer 27. The second work function layer 29 and the first work function layer 27 may include titanium nitrides with the same work function. Even though the second work function layer 29 has an N-type work function, a work function is increased by the total thickness obtained by summing the first work function layer 27 and the second work function layer 29. Therefore, by stacking the first work function layer 27 and the second work function layer 29, it is possible to achieve a high work function appropriate for a P-channel transistor.

When forming the second work function layer 29 in the NMOS region NMOS, the reaction between the first work function layer 27 and the second work function layer 29 is substantially prevented by the oxidation suppressing layer 28. That is to say, inter-mixing between the first work function layer 27 and the second work function layer 29 does not occur. Through this, since a process for removing the second work function layer 29 over the NMOS region NMOS may be omitted, processing may be simplified. Meanwhile, in the case where the oxidation suppressing layer 28 does not exist, as the second work function layer 29 and the first work function layer 27 react with each other, the work function of the first work function layer 27 increases.

Accordingly, in the present embodiment, by forming the oxidation suppressing layer 28 on the first work function layer 27, it is possible to substantially prevent the work function of the first work function layer 27 from being increased by the second work function layer 29. Through this, it is possible to achieve a work function appropriate for an N-channel transistor.

Also, when forming the second work function layer 29, the surface of the first work function layer 27 may be oxidized in the PMOS region PMOS. Accordingly, a work function is increased.

A capping layer 30 may be formed on the second work function layer 29. The capping layer 30 may include a polysilicon layer.

A metal-containing layer 31 may be formed on the capping layer 30. The metal-containing layer 31 may include a nickel-platinum alloy (NiPt).

Figure 4H:
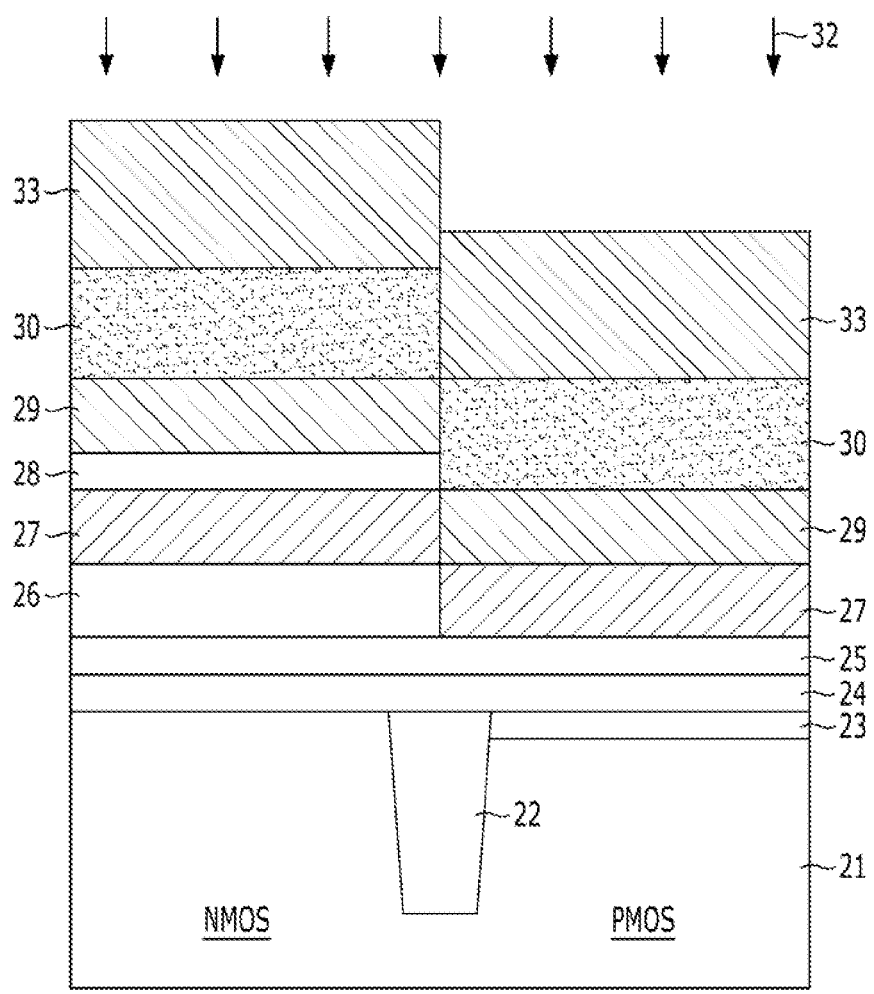

As shown in FIG. 4H, a high temperature thermal process 32 is performed. A low resistance layer 33 is formed by the high temperature thermal process 32. The low resistance layer 33 reduces the resistance of respective gate stacks. The low resistance layer 33 is formed by the reaction of the capping layer 30 and the metal-containing layer 31. In particular, the low resistance layer 33 is formed by full silicidation of the metal-containing layer 31. The top portion of the capping layer 30 is consumed for full silicidation of the metal-containing layer 31.

When performing the high temperature thermal process 32, a dipole-interface is formed on the interface of the interface layer 24 and the high-k dielectric layer 25 by the diffusion of the species contained in the threshold voltage modulation layer 26 (see the reference numerals 107N and 108N of FIG. 1). The dipole-interface may be formed by activation annealing for subsequently forming sources and drains.

Figure 4I:
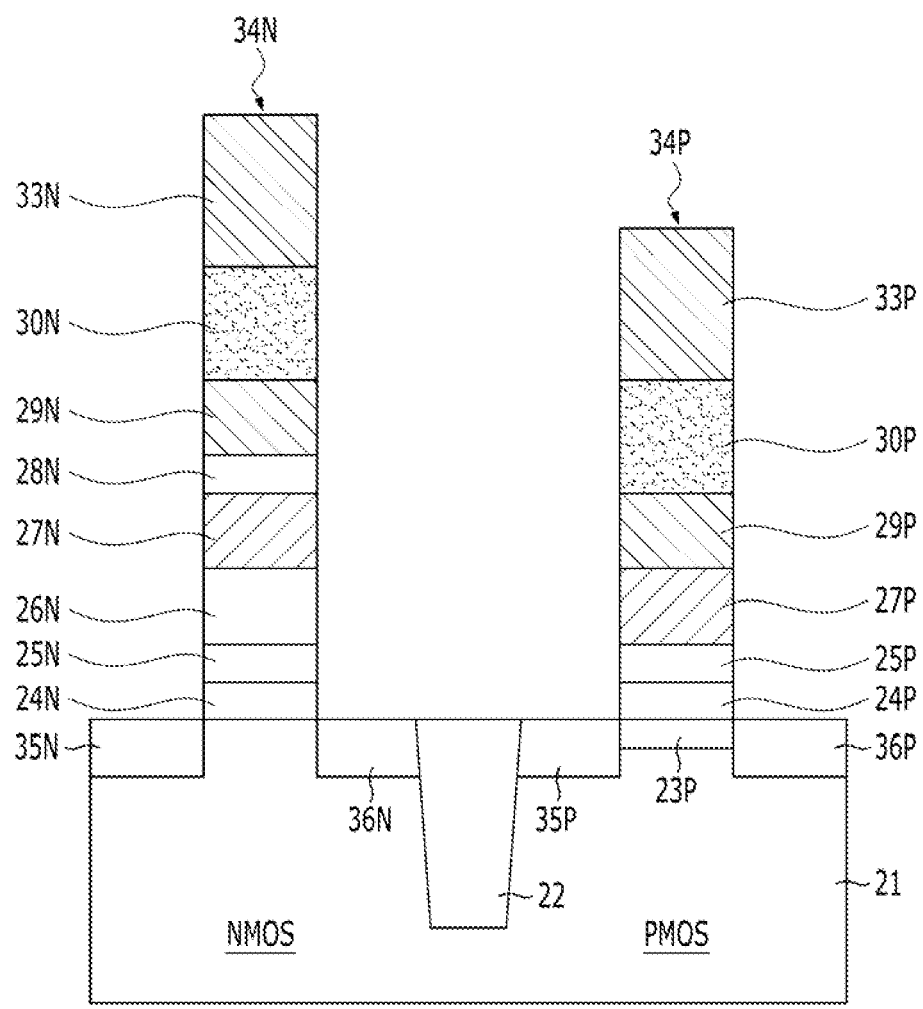

As shown in FIG. 4I, a gate patterning process is performed using a gate mask (not shown). For example, the low resistance layer 33, the capping layer 30, the second work function layer 29, the first work function layer 27, the high-k dielectric layer 25, and the interface layer 24 are sequentially etched. According to this fact, a first gate stack 34P may be formed over the PMOS region PMOS.

Further, the low resistance layer 33, the capping layer 30, the second work function layer 29, the oxidation suppressing layer 28, the first work function layer 27, the threshold voltage modulation layer 26, the high-k dielectric layer 25, and the interface layer 24 are sequentially etched. According to this fact, a second gate stack 34N may be formed over the NMOS region NMOS.

The first gate stack 34P and the second gate stack 34N may be formed through simultaneous patterning by using one gate mask.

In the first gate stack 34P, a first interface layer 24P, a first high-k dielectric layer 25P, a first work function layer 27P, a second work function layer 29P, a first capping layer 30P, and a first low resistance layer 33P may be stacked in that order.

In the second gate stack 34N, a second interface layer 24N, a second high-k dielectric layer 25N, a threshold voltage modulation layer 26N, a work function layer 27N, an oxidation suppressing layer 28N, a non-work function layer 29N, a second capping layer 30N, and a second low resistance layer 33N may be stacked in that order. The non-work function layer 29N may be formed by etching the second work function layer 29.

The non-work function layer 29N does not exert any influence on a change in the effective work function of the second gate stack 34N. In other words, the effective work function of the second gate stack 34N is modulated by the work function layer 27N.

The first interface layer 24P and the second interface layer 24N may be formed by etching the interface layer 24. The first high-k dielectric layer 25P and the second high-k dielectric layer 25N may be formed by etching the high-k dielectric layer 25.

In this way, a CMOSFET may include the first gate stack 34P and the second gate stack 34N for different threshold voltage modulation. The first gate stack 34P and the second gate stack 34N have different structures of work function layers. The first gate stack 34P may include the first work function layer 27P and the second work function layer 29P. The second gate stack 34N may include the work function layer 27N. The first gate stack 34P has a high work function by the dual layer of titanium nitrides. The second gate stack 34N has a low work function by the single layer of a titanium nitride.

Following the gate patterning process, processes conventionally known in the art may be performed. For example, processes for forming sources/drains, activation annealing, and so forth may be performed. The sources/drains include first sources/drains 35P/36P and second sources/drains 35N/36N. The first sources/drains 35P/36P are formed in the PMOS region PMOS. The second sources/drains 35N/36N are formed in the NMOS region NMOS. The first sources/drains 35P/36P include P-type dopants, and the second sources/drains 35N/36N include N-type dopants. A germanium-containing channel region 23P is formed under the first gate stack 34P.

By forming the first sources/drains 35P/36P and the second sources/drains 35N/36N in this way, a first transistor and a second transistor are formed. The first transistor may include the first gate stack 34P and the first sources/drains 35P/36P. The second transistor may include the second gate stack 34N and the second sources/drains 35N/36N. The first transistor may include a P-channel transistor which may include a PMOSFET. The second transistor may include an N-channel transistor which may include an NMOSFET. Accordingly, a CMOS circuit which may include the N-channel transistor and the P-channel transistor is formed on the substrate 21.

As a result, in the present exemplary implementation, in the integration process of the CMOS device, the threshold voltages of the N-channel transistor and the P-channel transistor may be independently modulated.

The CMOSFET according to the embodiments may be integrated in an integrated circuit.

The CMOSFET according to the embodiments may be applied to transistor circuits including transistors for various purposes. For example, the CMOSFET according to the embodiments may be applied to transistor circuits including an IGFET (insulated gate FET), an HEMT (high electron mobility transistor), a power transistor, a TFT (thin film transistor), and so forth.

The CMOSFET and the transistor circuit according to the embodiments may be built in an electronic device. The electronic device may include a memory and a non-memory. The memory may include an SRAM, a DRAM, a FLASH, an MRAM, an ReRAM, an STTRAM, an FeRAM and the like. The non-memory may include a logic circuit. The logic circuit may include a sense amplifier, a decoder, an input/output circuit and so forth, for controlling a memory device. Also, the logic circuit may include various ICs other than a memory. For example, the logic circuit may include a microprocessor, a mobile device, an application processor, and so forth. Further, the non-memory may include a logic gate such as a NAND gate, a driver IC for a display device, a power semiconductor device such as a power management IC (PMIC), and so forth. The electronic device may include a computing system, an image sensor, a camera, a mobile device, a display device, a sensor, a medical instrument, an optoelectronic device, an RFID (radio frequency identification), a photovoltaic cell, a semiconductor device for an automobile, a semiconductor device for a railroad car, a semiconductor device for an aircraft, and so forth.

Hereafter, various application examples including the transistor according to the embodiments will be described.

FIGS. 5A to 5D are diagrams showing various application examples of an integrated circuit including transistors according to the embodiments.

Figure 5A:
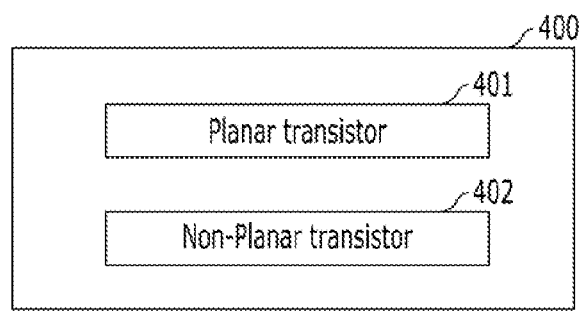
FIGS. 5A to 5D are diagrams showing various application examples of an integrated circuit including transistors according to the embodiments of the present invention.

An integrated circuit 400 shown in FIG. 5A may include a plurality of planar transistors 401 and a plurality of non-planar transistors 402.

Figure 5B:
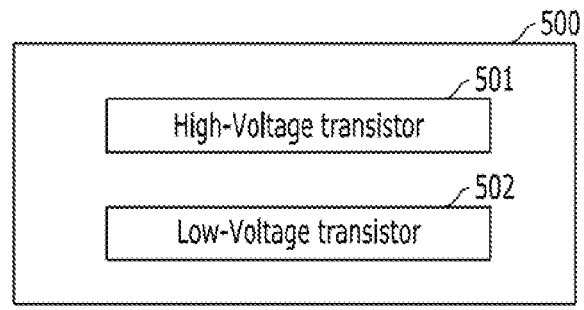

An integrated circuit 500 shown in FIG. 5B may include a plurality of high voltage transistors 501 and a plurality of low voltage transistors 502.

Figure 5C:
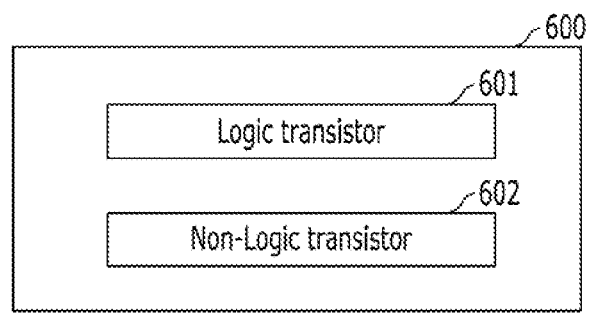

An integrated circuit 600 shown in FIG. 5C may include a plurality of logic transistors 601 and a plurality of non-logic transistors 602.

Figure 5D:
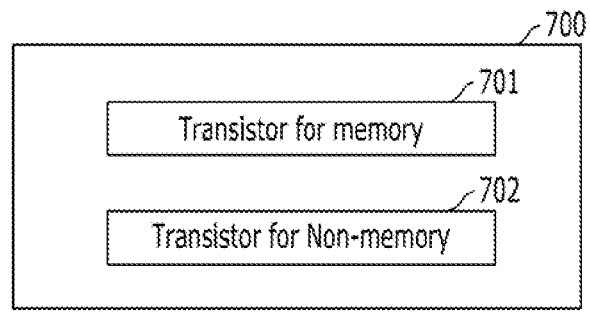

An integrated circuit 700 shown in FIG. 5D may include transistors 701 for a memory device and transistors 702 for a non-memory device.

The above-described planar transistors 401, non-planar transistors 402, high voltage transistors 501, low voltage transistors 502, logic transistors 601, non-logic transistors 602, transistors 701 for a memory device, and transistors 702 for a non-memory device may include transistors according to the embodiments. Therefore, it is possible to improve the performance of the integrated circuits 400, 500, 600 and 700.

Figure 6:
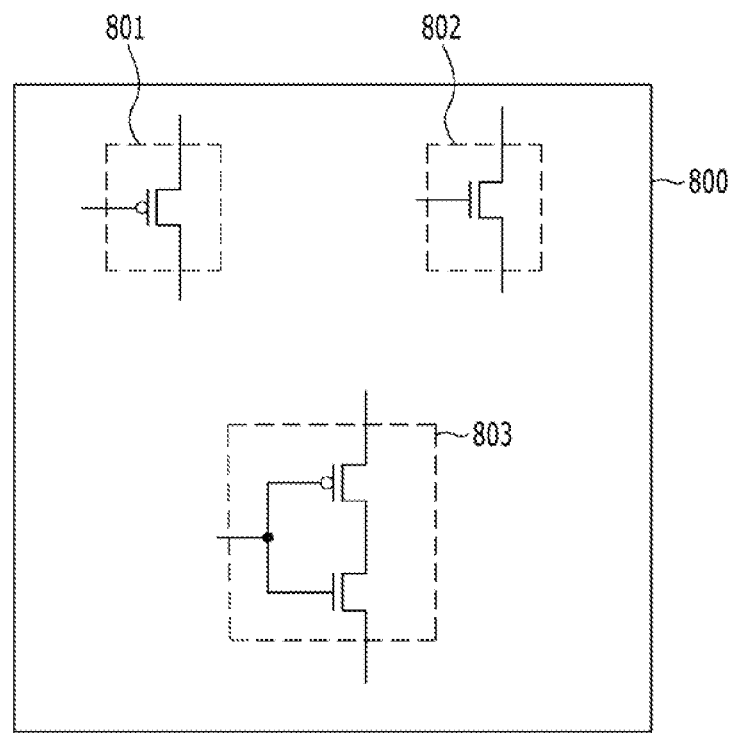
FIG. 6 is a diagram showing an electronic device including transistors according to the embodiments of the present invention.

FIG. 6 is a diagram showing an electronic device including transistors according to the embodiments.

Referring to FIG. 6, an electronic device 800 may include a plurality of PMOSFETs 801, a plurality of NMOSFETs 802 and a plurality of CMOSFETs 803. The PMOSFETs 801, the NMOSFETs 802 and the CMOSFETs 803 may include PMOSFETs, NMOSFETs and CMOSFETs according to the embodiments. Therefore, since the electronic device 800 may include the transistors with improved performance, the electronic device 800 may realize a high operation speed in correspondence to scaling-down.

Figure 7:
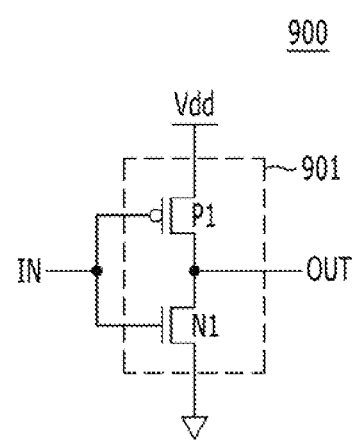
FIG. 7 is a circuit diagram showing an inverter including transistors according to the embodiments of the present invention.

FIG. 7 is a circuit diagram showing an inverter including transistors according to the embodiments. FIG. 7 shows a COMS inverter.

Referring to FIG. 7, an inverter 900 may be constituted by a CMOSFET 901 including a PMOSFET P1 and an NMOSFET N1 which are sequentially coupled from a power supply terminal Vdd. The power supply terminal Vdd may be coupled to the drain of the PMOSFET P1, and a ground terminal may be coupled to the source of the NMOSFET N1. The CMOSFET 901 may include the CMOSFET according to the embodiments.

Figure 8:
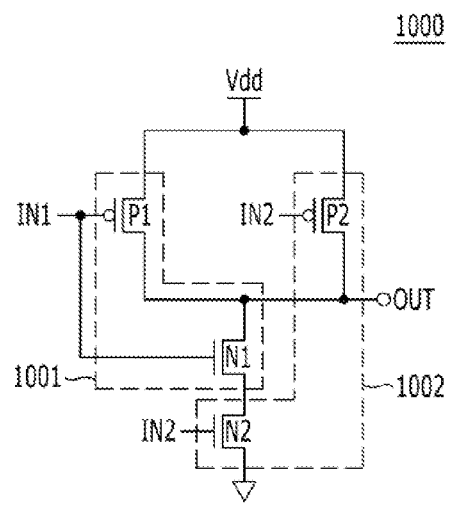
FIG. 8 is a circuit diagram showing a logic gate including transistors according to the embodiments of the present invention.

FIG. 8 is a circuit diagram showing a logic gate including transistors according to the embodiments. FIG. 8 shows a NAND gate.

Referring to FIG. 8, a NAND gate 1000 may include a first CMOSFET 1001 and a second CMOSFET 1002 to which different input signals IN1 and IN2 are transferred. The first CMOSFET 1001 may include a first PMOSFET P1 and a first NMOSFET N1 to which the first input signal IN1 is transferred. The second CMOSFET 1002 may include a second PMOSFET P2 and a second NMOSFET N2 to which the second input signal IN2 is transferred. Each of the first CMOSFET 1001 and the second CMOSFET 1002 constituting the NAND gate 1000 may include the CMOSFET according to the embodiments.

Figure 9:
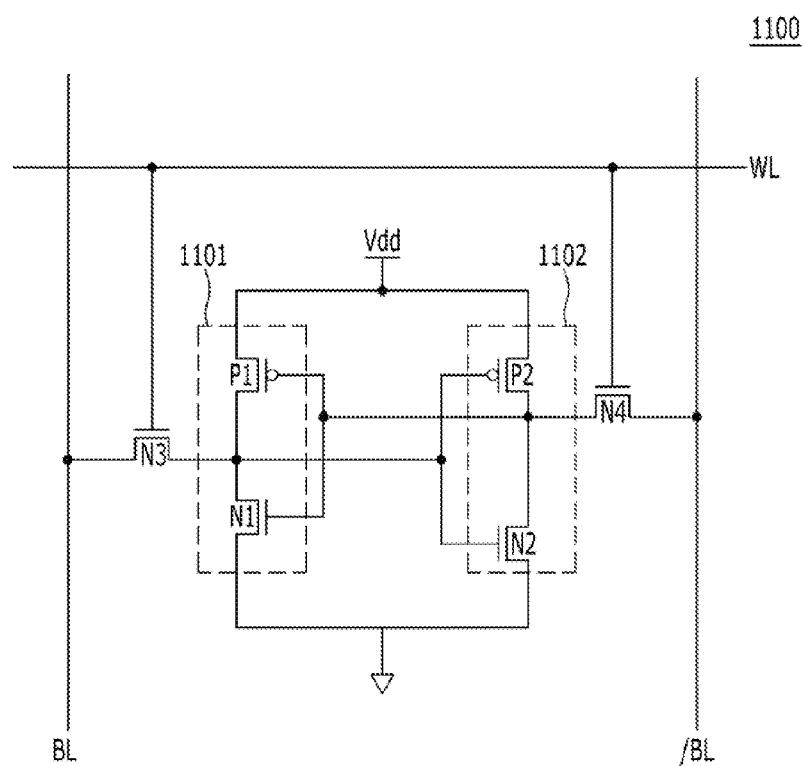
FIG. 9 is a circuit diagram showing a memory cell including transistors according to the embodiments of the present invention.

FIG. 9 is a circuit diagram showing a memory cell including transistors according to the embodiments. FIG. 9 shows an SRAM cell.

Referring to FIG. 9, an SRAM cell 1100 may include a plurality of transistors. For example, the SRAM cell 1100 may include PMOSFETs P1 and P2 that have sources that are coupled to a power supply terminal Vdd. Further, the SRAM cell 1100 may include NMOSFETs N1 and N2 that have sources that are grounded. The drains of the PMOSFET P1 and the NMOSFET N1 may be connected to each other, and the drains of the PMOSFET P2 and the NMOSFET N2 may be connected together. That is to say, two CMOSFETs 1101 and 1102 are included in the SRAM cell 1100. Moreover, an NMOSFET N3, having a gate that is connected to a word line WL, may be connected between the CMOSFET 1101 and a bit line BL. An NMOSFET N4, having a gate that is connected to the word line WL, may be connected between the CMOSFET 1102 and a bit line bar/BL. In this way, the CMOSFETs 1101 and 1102 and the NMOSFETs N3 and N4 are included in the SRAM cell 1100.

In FIG. 9, each of the NMOSFETs N1, N2, N3 and N4 and the PMOSFETs P1 and P2 may include a transistor according to the embodiments. Accordingly, the SRAM cell 1100 may operate at a high speed.

Figure 10:
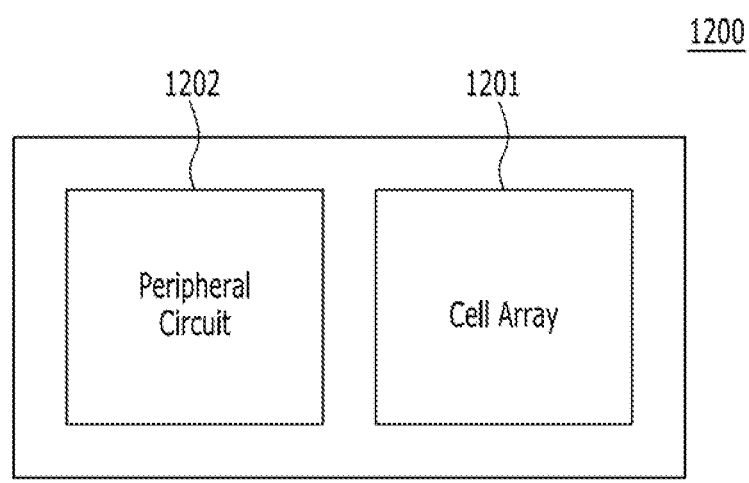
FIG. 10 is a diagram showing a memory device including transistors according to the embodiments of the present invention.

FIG. 10 is a diagram showing a memory device including transistors according to the embodiments.

Referring to FIG. 10, a memory device 1200 may include a memory cell array 1201 and a peripheral circuit 1202. The memory cell array 1201 may include SRAM cells which include transistors according to the embodiments of the present disclosure. Also, in the case where the memory cell array 1201 is a DRAM, a PRAM, an FeRAM or a flash memory, transistors according to the embodiments may be applied to the peripheral circuit 1202 of the memory cell array in 1201. The peripheral circuit 1202 may include a decoder, a sense amplifier, an I/O circuit, and so forth. The peripheral circuit 1202 may include a plurality of transistors. The transistors of the peripheral circuit 1202 may include transistors according to the embodiments. Accordingly, the memory device 1200 may operate at a high speed and may be scaled down.

Although various embodiments have been described for illustrative purposes, it will be apparent to those skilled in the art that various changes and modifications may be made without departing from the spirit and scope of the invention as defined in the following claims.

What is claimed is:

1. A method of fabricating a semiconductor device, the method comprising:
   preparing a substrate including a PMOS region and an NMOS region;
   forming a high-k dielectric layer over the substrate;
   forming a threshold voltage modulation layer over the high-k dielectric layer of the NMOS region;
   forming a first work function layer over the threshold voltage modulation layer of the NMOS region and the high-k dielectric layer of the PMOS region;
   forming, in-situ, an oxidation suppressing layer over the first work function layer of the NMOS region without an air break after the forming of the first work function layer;
   forming a second work function layer over the oxidation suppressing layer and the first work function layer of the PMOS region;
   forming, over the PMOS region of the substrate, a first gate stack that includes the high-k dielectric layer, the first work function layer and the second work function layer; and
   forming, over the NMOS region of the substrate, a second gate stack which includes the high-k dielectric layer, the threshold voltage modulation layer, the first work function layer, the oxidation suppressing layer and the second work function layer,
   wherein the oxidation suppressing layer is formed only the second gate stack.

2. The method according to claim 1, wherein the preparing the substrate comprises:
   forming a germanium-containing channel region over the PMOS region of the substrate.

3. The method according to claim 2, wherein the forming a germanium-containing channel region comprises:
   epitaxially growing a silicon-germanium layer; and
   epitaxially growing a silicon layer over the silicon-germanium layer.

4. The method according to claim 1, wherein, after the forming of the second work function layer, the method further comprising:
   forming a capping layer over the second work function layer; and
   forming, over the capping layer, a low resistance layer to reduce a resistance of the first gate stack and the second gate stack.

5. The method according to claim 1, wherein the forming the oxidation suppressing layer over the first work function layer of the NMOS region comprises:

forming, in-situ, a silicon layer over the first work function layer without exposing the silicon layer to ambient atmosphere;
forming, over the silicon layer, a mask layer that exposes the PMOS region; and
removing the silicon layer from the PMOS region via the mask layer.

6. The method according to claim 1, wherein, in the forming of the second work function layer comprises:
oxidizing a surface of the first work function layer of the PMOS region.

7. The method according to claim 1, wherein the first work function layer and the second work function layer comprise titanium nitrides with the same work function.

8. The method according to claim 1, wherein the forming the threshold voltage modulation layer comprises:
forming a lanthanum-based oxide that contains a lanthanum series element.

9. A method for fabricating a semiconductor device, the method comprising:
preparing a substrate including a PMOS region and an NMOS region;
forming a germanium-containing channel region over the PMOS region of the substrate;
forming a high-k dielectric layer over the substrate;
forming, over the high-k dielectric layer of the NMOS region, a threshold voltage modulation layer that includes a lanthanum series element;
forming a first titanium nitride layer over the threshold voltage modulation layer of the NMOS region and the high-k dielectric layer of the PMOS region;
forming, over the first titanium nitride layer of the NMOS region, an oxidation suppressing layer that contains silicon without an air break after the forming of the first titanium nitride layer;
forming a second titanium nitride layer over the oxidation suppressing layer and the first titanium nitride layer of the PMOS region;
forming, over the PMOS region of the substrate, a first gate stack that includes the high-k dielectric layer, the first titanium nitride layer and the second titanium nitride layer, over the PMOS region of the substrate; and
forming, over the NMOS region of the substrate, a second gate stack that includes the high-k dielectric layer, the threshold voltage modulation layer, the first titanium nitride layer, the oxidation suppressing layer and the second titanium nitride layer,
wherein the oxidation suppressing layer is formed only the second gate stack.

10. The method according to claim 9, wherein, after the forming of the second titanium nitride, the method further comprises:
forming a polysilicon capping layer over the second titanium nitride; and
forming a metal silicide layer over the polysilicon capping layer.

11. The method according to claim 9, wherein the forming the threshold voltage modulation layer comprises:
forming a lanthanum oxide layer.

12. The method according to claim 9, wherein the forming the oxidation suppressing layer over the first titanium nitride of the NMOS region comprises:
forming, in-situ, a silicon layer over the first titanium nitride without an exposure to ambient atmosphere;
forming, over the silicon layer, a mask layer that exposes the PMOS region; and
removing, via the mask layer, the silicon layer from the PMOS region.

13. The method according to claim 9, wherein, in the forming of the second titanium nitride comprises:
oxidizing a surface of the first titanium nitride of the PMOS region.

14. The method according to claim 9, wherein the first titanium nitride and the second titanium nitride are formed of titanium nitrides with the same work function.

15. The method according to claim 9, wherein the forming a germanium-containing channel region comprises:
epitaxially growing a silicon-germanium layer; and
epitaxially growing a silicon layer over the silicon-germanium layer.

* * * * *